United States Patent
Sohn et al.

(10) Patent No.: US 9,373,628 B2
(45) Date of Patent: Jun. 21, 2016

(54) SEMICONDUCTOR MEMORY DEVICE AND METHOD OF FABRICATING THE SAME

(71) Applicants: Woonghee Sohn, Seoul (KR); Kihyun Yun, Seoul (KR); Myoungbum Lee, Seoul (KR); Jeonggil Lee, Hwaseong-si (KR); Tai-Soo Lim, Seoul (KR); Yong Chae Jung, Suwon-si (KR)

(72) Inventors: Woonghee Sohn, Seoul (KR); Kihyun Yun, Seoul (KR); Myoungbum Lee, Seoul (KR); Jeonggil Lee, Hwaseong-si (KR); Tai-Soo Lim, Seoul (KR); Yong Chae Jung, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 103 days.

(21) Appl. No.: 14/171,056

(22) Filed: Feb. 3, 2014

(65) Prior Publication Data
US 2014/0220750 A1 Aug. 7, 2014

(30) Foreign Application Priority Data
Feb. 4, 2013 (KR) ........................ 10-2013-0012523

(51) Int. Cl.
| | |
|---|---|
| *H01L 21/336* | (2006.01) |
| *H01L 27/115* | (2006.01) |
| *H01L 29/66* | (2006.01) |
| *H01L 29/788* | (2006.01) |
| *H01L 29/792* | (2006.01) |

(52) U.S. Cl.
CPC .... *H01L 27/11556* (2013.01); *H01L 27/11582* (2013.01); *H01L 29/66825* (2013.01); *H01L 29/66833* (2013.01); *H01L 29/7889* (2013.01); *H01L 29/7926* (2013.01)

(58) Field of Classification Search
USPC ................... 257/315; 438/257, 259, 299, 269
See application file for complete search history.

(56) References Cited

U.S. PATENT DOCUMENTS

| | | | |
|---|---|---|---|
| 7,696,559 B2 | 4/2010 | Arai et al. | |
| 8,163,617 B2 | 4/2012 | Ahn | |
| 8,169,819 B2 | 5/2012 | Shima et al. | |
| 8,188,530 B2 | 5/2012 | Tanaka et al. | |
| 8,203,187 B2 | 6/2012 | Lung et al. | |
| 2007/0017445 A1* | 1/2007 | Takehara | C23C 14/568 118/719 |
| 2010/0182828 A1* | 7/2010 | Shima | H01L 45/1683 365/163 |
| 2011/0024818 A1* | 2/2011 | Ahn | H01L 21/28273 257/314 |
| 2011/0303971 A1 | 12/2011 | Lee et al. | |
| 2012/0112156 A1 | 5/2012 | Park et al. | |
| 2012/0161094 A1 | 6/2012 | Huo et al. | |
| 2014/0014889 A1* | 1/2014 | Shim | H01L 29/7827 257/1 |
| 2014/0106531 A1* | 4/2014 | Cabral, Jr. | H01L 21/28088 438/299 |

FOREIGN PATENT DOCUMENTS

KR 1020110003041 A 1/2011

\* cited by examiner

*Primary Examiner* — Errol Fernandes
(74) *Attorney, Agent, or Firm* — Myers Bigel & Sibley, P.A.

(57) ABSTRACT

Provided are a semiconductor device and a method of fabricating the same. The method may include forming an electrode structure including insulating layers and electrode layers alternatingly stacked on a substrate, forming a channel hole to penetrate the electrode structure, forming a data storage layer on a sidewall of the channel hole, and forming a semiconductor pattern on a sidewall of the data storage layer to be electrically connected to the substrate. The electrode layers may be metal-silicide layers, and the insulating layers and the electrode layers may be formed in an in-situ manner using the same deposition system.

16 Claims, 21 Drawing Sheets

SEMICONDUCTOR MEMORY DEVICE AND METHOD OF FABRICATING THE SAME

CROSS-REFERENCE TO RELATED APPLICATIONS

This U.S. non-provisional patent application claims priority under 35 U.S.C. §119 to Korean Patent Application No. 10-2013-0012523, filed on Feb. 4, 2013, in the Korean Intellectual Property Office, the entire contents of which are hereby incorporated by reference.

BACKGROUND

Embodiments of the inventive concept relate to a semiconductor device and a method of fabricating the same, and in particular, to a semiconductor memory device and a method of fabricating the same.

Highly integrated semiconductor memory devices have increased in demand with the development of electronic industry. The integration density of semiconductor memory devices can be a factor that may influence the cost of the semiconductor memory devices. That is, if the integration density of the semiconductor memory devices increases, the cost of the semiconductor memory devices may be lowered. The integration density of semiconductor memory devices, such as planar semiconductor memory devices, may be mainly determined by a planar area that a unit memory cell occupies. Accordingly, the integration density of the planar semiconductor memory devices may be affected by, for example, a technology for forming fine and small patterns. However, realizing fine patterns in the planar semiconductor memory devices may result in increasing manufacturing costs and/or high priced apparatuses. Therefore, there may be some limitations in forming the small and fine patterns.

Recently, three dimensional semiconductor devices, including memory cells arranged in a three dimensional array, have been proposed to overcome the above limitations. Nevertheless, new processes which are capable of reducing bit cost and realizing reliable products are still required for successful mass production of the three dimensional semiconductor memory devices.

SUMMARY

Some embodiments of the inventive concept provide simplified fabricating methods and memory devices fabricated thereby.

Other embodiments of the inventive concept provide highly-integrated semiconductor devices and methods of fabricating the same.

According to some embodiments, a method of fabricating a semiconductor memory device may include forming an electrode structure including insulating layers and electrode layers alternatingly stacked on a substrate, forming a channel hole to penetrate the electrode structure, forming a data storage layer on a sidewall of the channel hole, and forming a semiconductor pattern on a sidewall of the data storage layer to be electrically connected to the substrate. The electrode layers may be metal-silicide layers, and the insulating layers and the electrode layers may be formed in an in-situ manner using the same deposition system.

In some embodiments, the deposition system may include a first chamber, in which the electrode layers may be formed, and a second chamber, in which the insulating layers may be formed.

In some embodiments, the first chamber may be a physical vapor deposition (PVD) chamber and the second chamber may be a chemical vapor deposition (CVD) chamber.

In some embodiments, the electrode layers may be formed using a metal-silicide target.

In some embodiments, the electrode layers may be formed using a metal target and a silicon target.

In some embodiments, the method may further include, after the forming of the semiconductor pattern, forming a trench penetrating the electrode structure, and sequentially forming an insulating spacer and a through electrode in the trench.

In some embodiments, the method may further include forming a metal-silicide layer between the through electrode and the substrate.

In some embodiments, the method may further include partially removing the electrode layers exposed by the trench to form first recess regions, and forming conductive patterns in the first recess regions to be in contact with the electrode layers.

In some embodiments, the conductive patterns may include a conductive metal nitride.

In some embodiments, the method may further include selectively removing the insulating layers exposed by the trench to form second recess regions, and forming an additional insulating layer defining air gaps in the second recess regions.

In some embodiments, the forming of the insulating spacer may include anisotropically etching the additional insulating layer.

According to some embodiments, a semiconductor memory device may include an electrode structure including insulating layers and gate electrode layers that may be alternatingly stacked on a substrate, data storage layers and semiconductor patterns sequentially provided in through holes penetrating the electrode structure, a through electrode provided between the through holes, and an insulating spacer provided between the through electrode and the electrode layers. The gate electrode layers may include a conductive metal nitride layer in contact with the data storage layer and a metal-silicide layer in contact with the insulating spacer.

In some embodiments, the insulating layers may be formed to define air gaps provided therein.

In some embodiments, the insulating layers and the insulating spacer may include the same material.

In some embodiments, the device may further include a metal-silicide layer between the through electrode and the substrate.

According to some embodiments, a method of fabricating a semiconductor memory device may include forming an electrode structure including insulating layers and electrode layers alternatingly stacked on a substrate in an in-situ manner using the same deposition system. The method may also include forming a channel hole to penetrate the electrode structure and forming a data storage layer on a sidewall of the channel hole. The electrode layers may comprise metal-silicide layers.

In some embodiments, the method may include forming electrode layers of the electrode structure comprises a sputtering process using a metal-silicide and/or silicon target. The method may further comprise forming a metal nitride layer between the electrode layers and the data storage layer.

In some embodiments, the deposition system may comprise a first chamber, in which the electrode layers are formed, and a second chamber, in which the insulating layers are formed.

In some embodiments, the method may include transferring the substrate between the first chamber and the second chamber without substantial breakage of a vacuum level. The first chamber and the second chamber may be part of the same vacuum system.

In other embodiments, the first chamber and the second chamber may have different vacuum levels.

In some embodiments, the method may also include performing a first deposition process in the first chamber and performing a second deposition process in the second chamber, wherein the first and second deposition processes are different.

According to some embodiments, the method may include forming a semiconductor pattern on a sidewall of the data storage layer to be electrically connected to the substrate, forming a trench penetrating the electrode structure, sequentially forming an insulating spacer and a through electrode in the trench, and forming a metal-silicide layer between the through electrode and the substrate.

According to some embodiments, a method of fabricating a semiconductor memory device may include forming an electrode structure including first insulating layers and metal-silicide electrode layers alternatingly stacked on a substrate in an in-situ manner using the same deposition system. The insulating layers may be formed in a first chamber of the same deposition system and the metal-silicide electrode layers are formed in a second chamber of the same deposition system. The method may also include forming a channel hole to penetrate the electrode structure through to the substrate and forming a trench to penetrate the electrode structure through to the substrate. The method may further include removing the first insulating layers exposed by the channel hole and the trench to form first recess regions and forming second insulating layers in the first recess regions using a deposition technique providing a poor step coverage property so as to form the second insulating layers in the first recess regions having air gaps.

The method may also include partially removing the electrode layers exposed by the channel hole to form second recess regions, forming a metal-nitride conductive layer in the channel hole and partially removing the metal-nitride conductive layer to form metal-nitride conductive patterns in the second recess regions, the metal-nitride conductive patterns to be in contact with the electrode layers. The method may include forming a data storage layer on a sidewall of the channel hole contacting the metal-nitride conductive patterns, forming a first semiconductor pattern on a sidewall of the data storage layer and forming a second semiconductor pattern on a sidewall of the first semiconductor pattern to be electrically connected to the substrate. The method may also include sequentially forming an insulating spacer and a through electrode in the trench and forming a metal-silicide layer between the through electrode and the substrate.

BRIEF DESCRIPTION OF THE DRAWINGS

Various embodiments will be more clearly understood from the following brief description taken in conjunction with the accompanying drawings. The accompanying drawings represent non-limiting, example embodiments as described herein.

Figure 1:
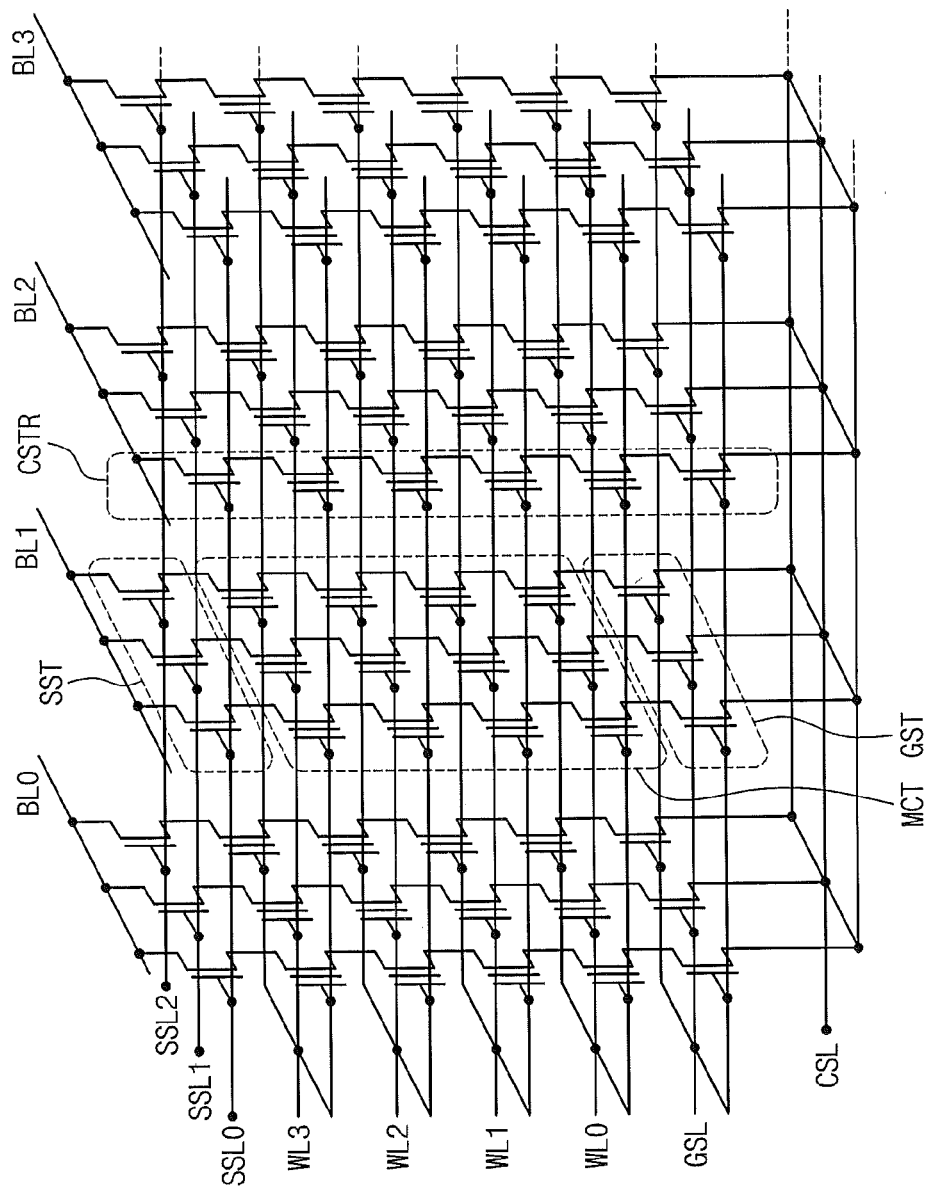
FIG. 1 is an equivalent circuit diagram of a semiconductor memory device according to some embodiments of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Some embodiments of the inventive concepts will now be described more fully with reference to the accompanying drawings, in which some embodiments are shown. Embodiments of the inventive concepts may, however, be embodied in many different forms and should not be construed as being limited to the embodiments set forth herein; rather, these embodiments are provided so that this disclosure will be thorough and complete, and will fully convey the concept of the embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to limit the embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is an equivalent circuit diagram of a semiconductor memory device according to some embodiments of the inventive concept.

Referring to FIG. 1, a semiconductor memory device according to an embodiment may include a common source line CSL, a plurality of bit lines BL0, BL1, BL2 and BL3, and a plurality of cell strings CSTR disposed between the common source line CSL and the bit lines BL0-BL3.

The common source line CSL may be a conductive layer disposed on a substrate (e.g., a semiconductor substrate) or an impurity region formed in the substrate. The bit lines BL0-BL3 may be conductive patterns (e.g., metal lines) disposed over the substrate and separated from the substrate. The bit lines BL0 to BL3 may be two dimensionally arrayed, and a plurality of cell strings CSTR may be electrically connected in parallel (to one another to each of the bit lines BL0 to BL3. Thus, the cell strings CSTR may be two dimensionally arrayed on the common source line CSL or the substrate.

Each of the cell strings CSTR may be configured to include a ground selection transistor GST connected to the common source line CSL, a string selection transistor SST connected to one of the bit lines BL0-BL3, and a plurality of memory cell transistors MCT disposed between the ground selection transistor GST and the string selection transistor SST. The ground selection transistor GST, the plurality of memory cell transistors MCT and the string selection transistor SST constituting each of the cell strings CSTR may be serially connected to each other. In addition, gate electrodes of the ground selection transistors GST may extend to form a ground selection line GSL, and gate electrodes of the string selection transistors SST may extend to form a plurality of string selection lines SSL0, SSL1 and SSL2. Further, gate electrodes of the memory cell transistors MCT may extend to form a plurality of word lines WL0, WL1, WL2 and WL3. The ground selection line GSL, the string selection lines SSL0 to SSL2 and the word lines WL0 to WL3 may be disposed between the common source line CSL and the bit lines BL0 to BL3.

The ground selection transistors GST may be located at substantially the same distance from the substrate, and the gate electrodes of the ground selection transistors GST may be commonly connected to the ground selection line GSL to have the same electrical potential. Accordingly, the ground selection line GSL may be a plate-shaped conductive pattern or a comb-shaped conductive pattern which is disposed between the common source line CSL and the lowermost memory cell transistors MCT closest to the common source line CSL. Similarly, the gate electrodes of the memory cell transistors MCT, which are located at the same level from the common source line CSL, may also be connected to one of the word lines WL0 to WL 3 to have the same electrical potential. Thus, each of the word lines WL0 to WL3 may be a plate-shaped conductive pattern or a comb-shaped conductive pattern which is parallel with the substrate. Meanwhile, since the memory cell transistors MCT constituting each of the cell strings CSTR are located at different levels from one another, the plurality of word lines WL0 to WL3 disposed between the common source lines CSL and the bit lines BL0 to BL3 may also be located at different levels from one another. That is, the plurality of word lines WL0 to WL3 may be vertically stacked to form a multi-layered structure.

Each of the cell strings CSTR may include a semiconductor pillar that vertically extend to be connected to one of the bit lines BL0 to BL3. The semiconductor pillar of each of the cell strings CSTR may penetrate the ground selection line GSL and the word lines WL0 to WL3. In addition, the semiconductor pillar of each of the cell strings CSTR may include a body and an impurity region formed in one end of the body. Alternatively, the semiconductor pillar of each of the cell strings CSTR may include a body and at least one impurity region formed in at least one end of the body. For example, the semiconductor pillar may include a body and a drain region formed in an upper portion of the body.

A data storage layer may be disposed between the word lines WL0 to WL3 and each of the semiconductor pillars. In some embodiments, the data storage layer may include a charge storage layer. For example, the data storage layer may be an insulating charge trap layer, a conductive floating gate, or an insulating layer with conductive nano dots.

A dielectric layer, which acts as a gate insulation layer of the ground selection transistor GST or the string selection transistors SST, may be disposed between the ground selection line GSL and the semiconductor pillars or between the string selection lines SSL0 to SSL2 and the semiconductor pillars. The gate insulation layer of the ground selection transistor GST and/or the gate insulation layer of the string selection transistors SST may be formed of the same material as the data storage layer of the memory cell transistors MCT. Alternatively, the gate insulation layer of the ground selection transistor GST and/or the gate insulation layer of the string selection transistors SST may be formed of a gate oxide layer (e.g., a silicon oxides layer) commonly used in a metal-oxide-semiconductor field effect transistor (MOSFET).

Each of the ground and string selection transistors GST and SST and the memory cell transistors MCT may have a similar structure to the MOSFET that employs the semiconductor pillar as a channel region. That is, source/drain regions may be disposed in some portions of the semiconductor pillar, which are located between the ground selection line GSL, the word lines WL0 to WL3 and the string selection line SSL. Alternatively, the word lines WL0 to WL3 may constitute a plurality of MOS capacitors together with the semiconductor pillar without any source/drain regions therebetween. In this case, if a voltage higher than threshold voltages of the MOS capacitors is applied to the word lines WL0 to WL3, inversion regions corresponding to the source/drain regions may be formed in the semiconductor pillar between the word lines WL0 to WL3. This may be due to fringing fields. Thus, the memory cell transistors MCT of each of the cell strings CSTR may be electrically connected to one another even without formation of the source/drain regions.

Figure 2:
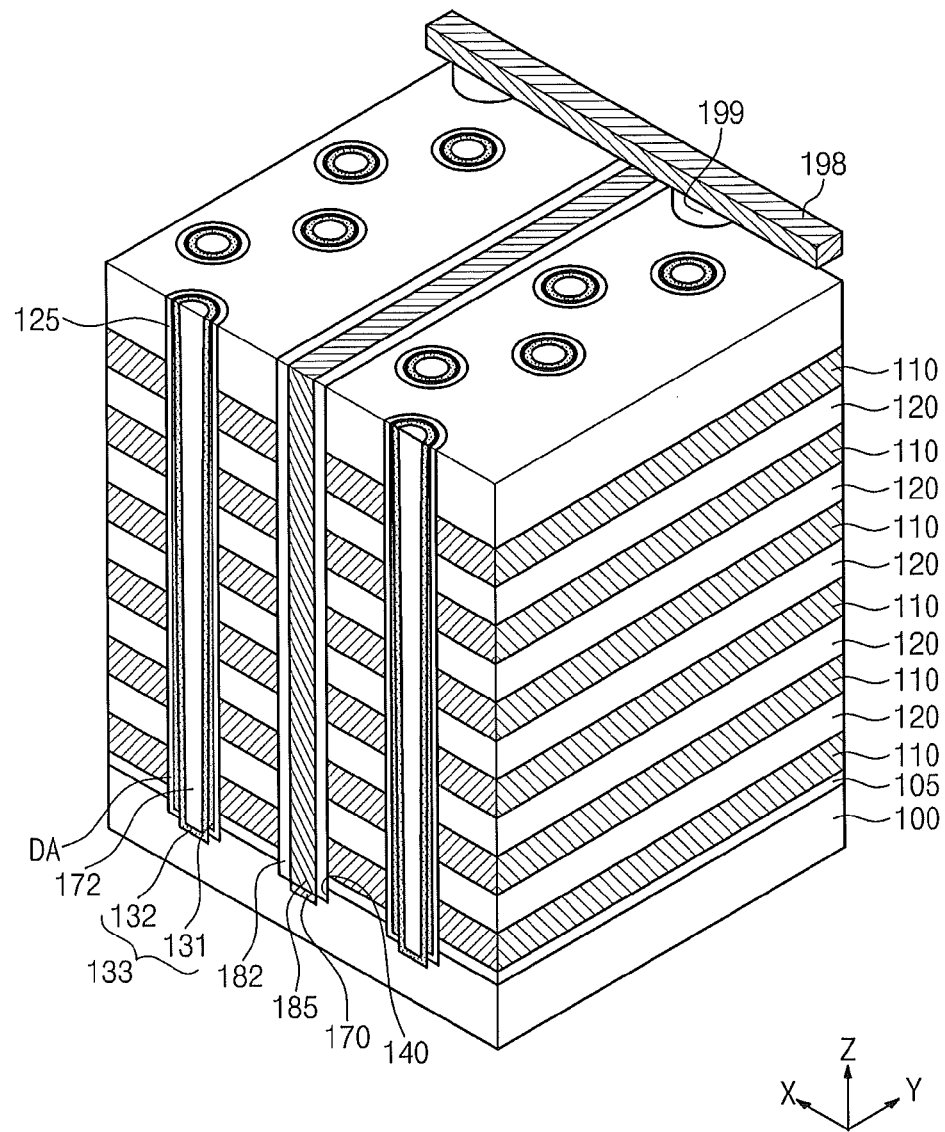
FIG. 2 is a perspective view of a semiconductor memory device according to some embodiments of the inventive concept.

FIG. 2 is a perspective view of a semiconductor memory device according to some embodiments of the inventive concept.

Referring to FIG. 2, a substrate 100 may be provided. The substrate 100 may be one of a silicon wafer, a germanium wafer, or a silicon-germanium wafer. For example, the substrate 100 may be a wafer doped with p-type dopants. An electrode structure may be provided on the substrate 100. The electrode structure may include insulating layers 120 and a plurality of electrode layers 110 spaced apart from each other in a z direction by the insulating layers 120. The lowermost one of the electrode layers 110 may serve as a lower selection gate pattern, and the uppermost one may serve as an upper selection gate pattern. Gate patterns between the upper and lower selection gate patterns may serve as cell gate patterns. An insulating buffer layer 105 may be provided between the substrate 100 and the lower selection gate pattern to be in contact with the substrate 100. The electrode layers 110 may be formed to have at least two different thicknesses, although illustrated to have the same thickness. For example, one or all of the lower and upper selection gate patterns may be thicker than each of the cell gate patterns.

The electrode layers 110 may be metal-silicide layers. For example, the electrode layers 110 may include at least one of cobalt silicide, nickel silicide, boron silicide, calcium silicide, cerium silicide, chromium silicide, hafnium silicide, molybdenum silicide, niobium silicide, platinum silicide, rhodium silicide, tantalum silicide, titanium silicide, tungsten silicide, vanadium silicide, or zirconium silicide. The insulating layers 120 may include at least one of a silicon oxide layer, a silicon nitride layer, or a silicon oxynitride layer, or include an insulating layer, whose dielectric constant is lower than that of the silicon oxide layer. The insulating buffer layer 105 may include a silicon oxide layer.

In order to reduce complexity in the drawings and to provide better understanding of some embodiments of the inventive concept, the electrode layers 110 and the insulating layers 120 were illustrated in FIGS. 2 and 4-16 to have six-layered structure. In addition, the upper and lower selection gate patterns may be provided to have a multi-layered structure.

Channel holes 125 may be formed to expose the substrate 100 through the electrode structure, and data storage layers DA may be provided on sidewalls of the channel holes 125. The data storage layers DA may include a plurality of insulating layers. For example, the data storage layers DA may include at least one nitride layer. The data storage layers DA will be described in more detail with reference to FIGS. 17 and 18.

Semiconductor patterns 133 may be provided on sidewalls of the data storage layers DA and be electrically connected to the substrate 100. The semiconductor patterns 133 may be substantially perpendicular to the top surface of the substrate 100. Each of the semiconductor patterns 133 may include a first semiconductor pattern 131 and a second semiconductor pattern 132 sequentially stacked on the data storage layers DA. The first semiconductor pattern 131 may be provided on a sidewall of the data storage layer DA to have a spacer shape, and the second semiconductor pattern 132 may be connected to the substrate 100 through the data storage layer DA. For example, the first and second semiconductor patterns 131 and 132 may include at least one of silicon, germanium, or silicon-germanium.

Insulating gap-fill patterns 172 may be provided on the second semiconductor patterns 132. For example, the insulating gap-fill patterns 172 may fill the channel holes 125 provided with the data storage layers DA and the semiconductor patterns 133. The insulating gap-fill patterns 172 may include at least one of a silicon oxide layer, a silicon nitride layer, or a silicon oxynitride layer.

A through electrode 185 may be provided between the semiconductor patterns 133 to extend along y direction. For example, the through electrode 185 may be provided in a trench 140. In some embodiments, the through electrode 185 may constitute a part of the common source line. For example, the through electrode 185 may include tungsten, titanium, or tantalum. An insulating spacer 182 may be provided between the through electrode 185 and the electrode layers 110. The insulating spacer 182 may separate the electrode layers 110 electrically from the through electrode 185. The insulating spacer 182 may extend along a sidewall of the through electrode 185. The insulating spacer 182 may include at least one of a silicon oxide layer, a silicon nitride layer, or a silicon oxynitride layer.

A metal-silicide layer 170 may be provided between the through electrode 185 and the substrate 100. The metal-silicide layer 170 may contribute to reduce a contact resistance between the through electrode 185 and the substrate 100. For example, the metal-silicide layer 170 may include at least one of tungsten silicide, titanium silicide, or cobalt silicide.

Conductive lines 198 may be provided on the semiconductor patterns 133 to be connected to the semiconductor patterns 133, electrically. The conductive lines 198 may extend along a direction (hereinafter, x direction) crossing the electrode layers 110. Each of the conductive lines 198 may be electrically connected to a plurality of the semiconductor patterns 133 arranged along the x direction. The conductive lines 198 and the semiconductor patterns 133 may be electrically connected to each other via contact plugs 199. The conductive lines 198 and the contact plugs 199 may include at least one of metals, conductive metal nitrides, or doped semiconductor materials.

Figure 17:
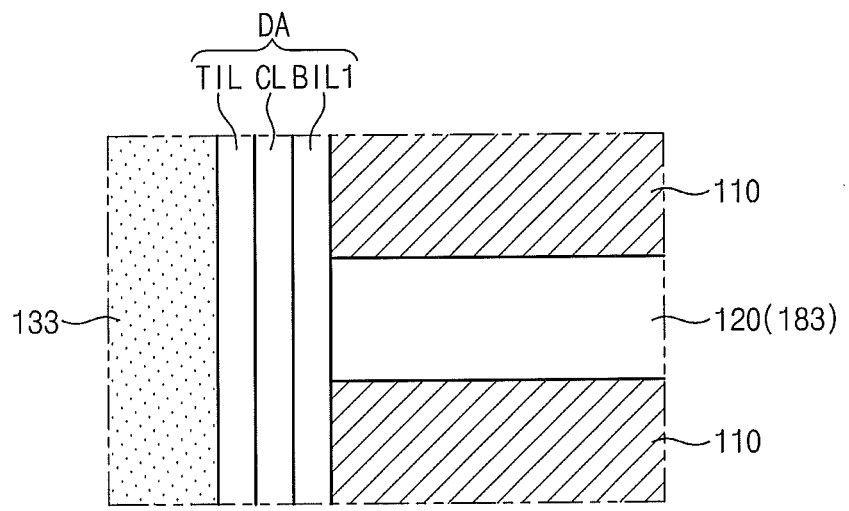
FIGS. 17 and 18 are perspective views illustrating data storage layers according to some embodiments of the inventive concept.
Figure 18:
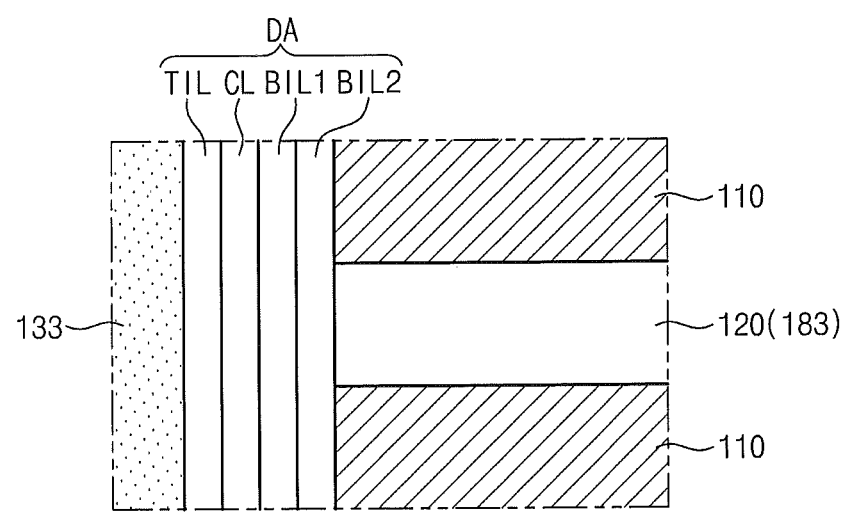

FIGS. 17 and 18 are perspective views illustrating data storage layers according to some embodiments of the inventive concept. The data storage layers DA may include a charge storing layer CL. The charge storing layer CL may include one of insulating layers with many trap sites and insulating layers with nano particles and be formed by one of a chemical vapor deposition (CVD) or an atomic layer deposition (ALD). For example, the charge storing layer CL may include one of a trap insulating layer, a floating gate electrode, or an insulating layer with conductive nano dots. Alternatively, the charge storing layer CL may include at least one of a silicon nitride layer, a silicon oxynitride layer, a silicon-rich nitride layer, a nanocrystalline silicon layer, or a laminated trap layer.

The data storage layer DA may include a tunnel insulating layer TIL interposed between the charge storing layer CL and the semiconductor pattern 133. The tunnel insulating layer TIL may include a material, whose bandgap is greater than that of the charge storing layer CL, and be formed by one of a chemical vapor deposition or an atomic layer deposition. In some embodiments, the tunnel insulating layer TIL may be a silicon oxide layer, which may be formed using one of the deposition techniques. Further, a thermal treatment process may be performed on the tunnel insulating layer TIL. The thermal treatment process may be a rapid thermal nitridation (RTN) or an annealing process performed under an ambient containing at least one of nitrogen or oxygen.

As shown in FIG. 17, the data storage layer DA may include a first insulating blocking layer BIL1 interposed between the charge storing layer CL and the electrode layers 110. Alternatively, as shown in FIG. 18, the data storage layer DA may include a first insulating blocking layer BIL1 and a second insulating blocking layer BIL2 interposed between the charge storing layer CL and the electrode layers 110. The first and second insulating blocking layers BIL1 and BIL2 may be formed of different materials, and one of the first and second insulating blocking layers BIL1 and BIL2 may have a bandgap that is lower than that of the tunnel insulating layer TIL and higher than that of the charge storing layer CL. The first and second insulating blocking layers BIL1 and BIL2 may be formed using one of a chemical vapor deposition or an atomic layer deposition, and at least one of them may be formed using a wet oxidation process. In some embodiments, the first insulating blocking layer BIL1 may be one of high-k dielectrics (e.g., aluminum oxide and hafnium oxide), and the second insulating blocking layer BIL2 may be a material whose dielectric constant is lower than that of the first insulating blocking layer BILL In other embodiments, the second insulating blocking layer BIL2 may be one of the high-k dielectrics, and the first insulating blocking layer BIL1 may be a material, whose dielectric constant is lower than that of the second insulating blocking layer BIL2.

Figure 3:
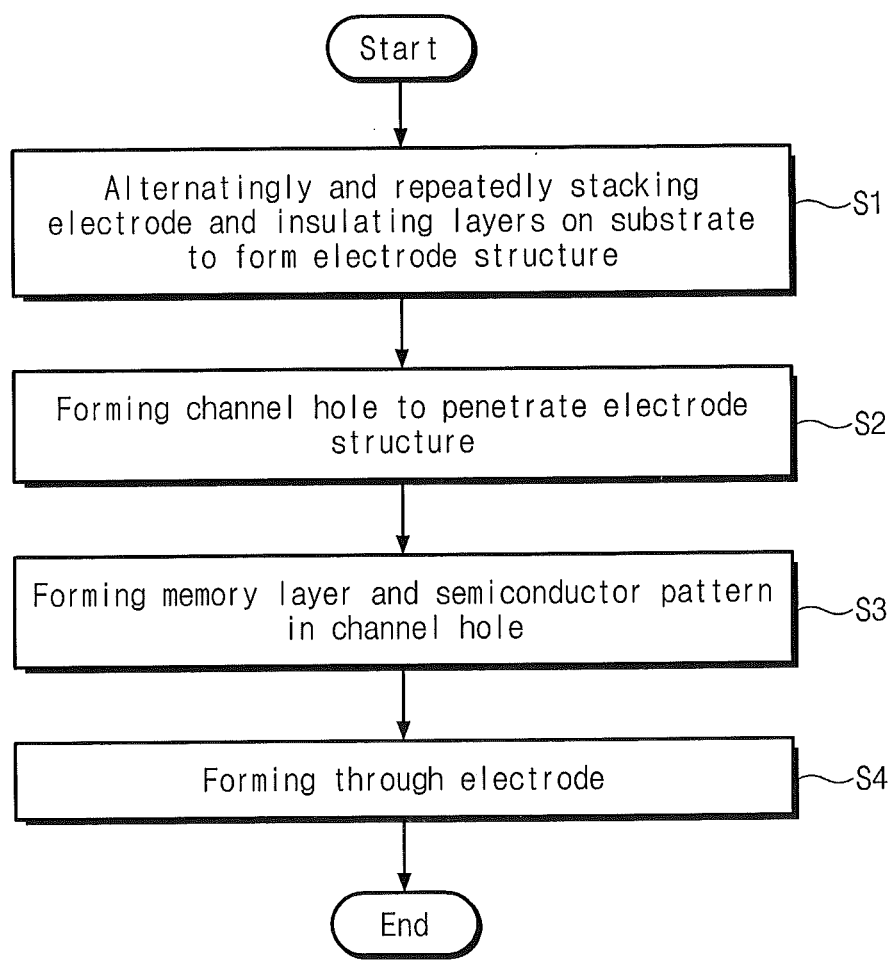
FIG. 3 is a flow chart illustrating a method of fabricating a semiconductor memory device, according to some embodiments of the inventive concept.

FIG. 3 is a flow chart illustrating a method of fabricating a semiconductor memory device, according to some embodiments of the inventive concept. FIGS. 4 through 9 are sectional views illustrating a method of fabricating a semiconductor memory device, according to some embodiments of the inventive concept.

Figure 4:
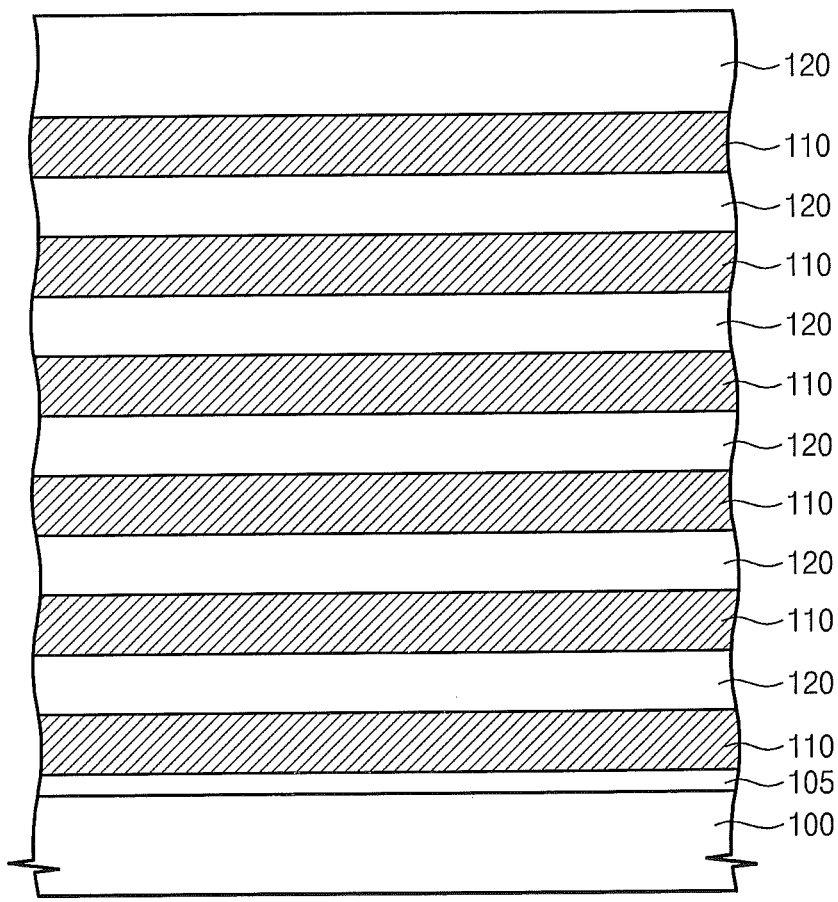
FIGS. 4 through 9 are sectional views illustrating a method of fabricating a semiconductor memory device, according to some embodiments of the inventive concept.

Referring to FIGS. 3 and 4, the electrode layers 110 and the insulating layers 120 may be alternatingly and repeatedly stacked on the substrate 100 to form an electrode structure (in S1). The electrode layers 110 may be metal-silicide layers. The substrate 100 may be a semiconductor substrate. For example, the substrate 100 may be a silicon wafer, a germanium wafer, a silicon-germanium wafer, or a compound semiconductor wafer. The electrode layers 110 and the insulating layers 120 may be formed in an in-situ manner within the same deposition system.

Here, the in-situ process may include a plurality of process steps that are performed in a plurality of chambers, respectively, constituting a same vacuum system. In addition, the same vacuum system may refer to a cluster of chambers, in which a wafer can be transferred from one to another without a substantial breakage of a vacuum level. In some embodiments, the chambers may be configured to have different vacuum levels from each other.

Figure 19:
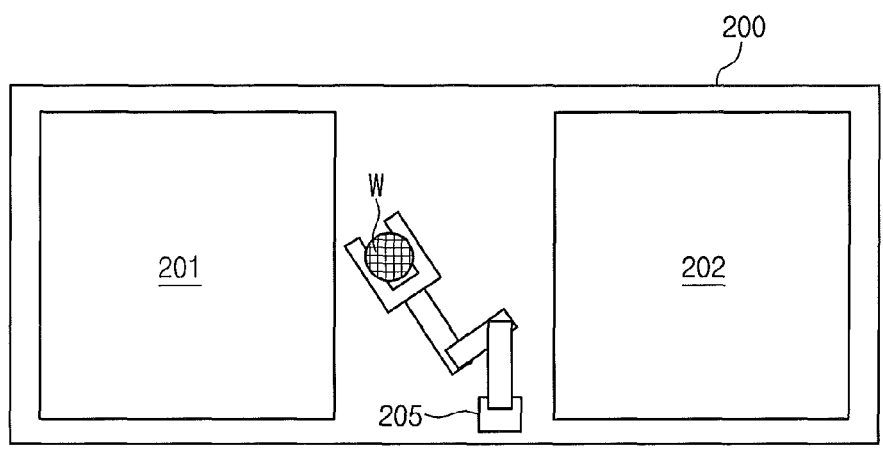
FIG. 19 is a schematic diagram illustrating a deposition apparatus, which may be used to form electrode layers and insulating layers, according to some embodiments of the inventive concept.

FIG. 19 is a schematic diagram illustrating a deposition apparatus 200, which may be used to form the electrode layers 110 and the insulating layers 120, according to some embodiments of the inventive concept. The deposition apparatus 200 may include a first chamber 201 and a second chamber 202. A wafer transporter 205 may be provided between the first and second chambers 201 and 202 to grasp a wafer W. The electrode layers 110 may be formed in a first chamber 201, and the insulating layers 120 may be formed in the second chamber 202. The first and second chambers 201 and 202 may be chambers constituting the same vacuum system. For example, the wafer W may be transported between the first and second chambers 201 and 202 by the wafer transporter 205, without a substantial breakage of a vacuum level of the deposition apparatus 200. The first and second chambers 201 and 202 may be configured to perform deposition processes different from each other. For example, the first chamber 201 may be configured to perform a PVD process, and the second chamber 202 may be configured to perform a CVD process.

The electrode layers 110 may include at least one of cobalt silicide, nickel silicide, boron silicide, calcium silicide, cerium silicide, chromium silicide, hafnium silicide, molybdenum silicide, niobium silicide, platinum silicide, rhodium silicide, tantalum silicide, titanium silicide, tungsten silicide, vanadium silicide, or zirconium silicide. For example, the electrode layers 110 may be formed by a sputtering process, in which a metal-silicide target is used. In other embodiments, the electrode layers 110 may be formed by a sputtering process, in which a metal target and/or a silicon target are used. The insulating layers 120 may be formed of a material having an etch selectivity with respect to the electrode layers 110. For example, the insulating layers 120 may include a silicon oxide layer, a silicon nitride layer, or a silicon oxynitride layer. In other embodiments, the insulating layers 120 may include an insulating layer, whose dielectric constant is lower than that of the silicon oxide layer.

The insulating buffer layer 105 may be provided between the lowermost one of the electrode layers 110 and the substrate 100. The insulating buffer layer 105 may be a silicon oxide layer. For example, the insulating buffer layer 105 may be formed by a thermal oxidation process or a CVD process.

Figure 5:
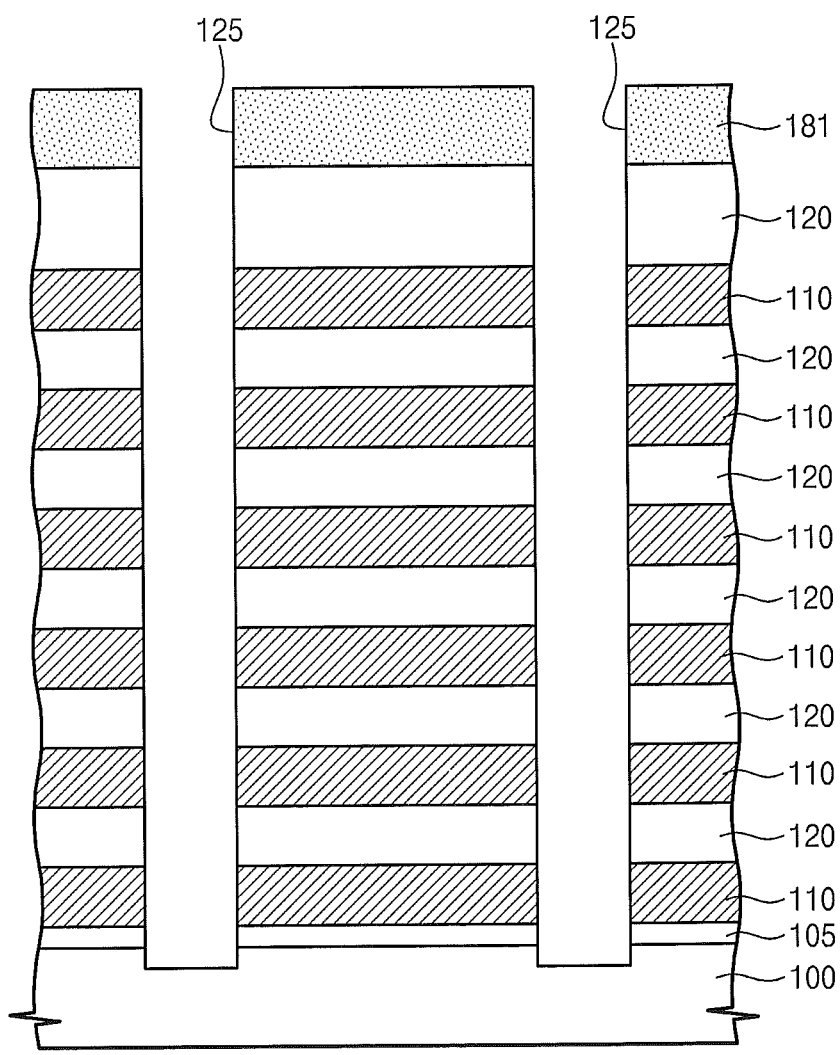

Referring to FIGS. 3 and 5, the channel holes 125 may be formed through the electrode structure (in S2). The formation of the channel holes 125 may include forming a mask pattern 181 on the electrode structure, and performing an etching process using the same as an etch mask. The mask pattern 181 may be formed of a material having an etch selectivity with respect to the electrode layers 110 and the insulating layers 120. For example, the mask pattern 181 may be formed of a polysilicon-containing material. Layers provided below the mask pattern 181 may be sequentially etched using the mask pattern 181 as an etch mask. The etching process may be performed, for example, at a high temperature of about 150° C. in a plasma manner. Further, the etching process may be performed, for example, using an etching gas containing $Cl_2$ and Ar. In other embodiments, the etching gas may include $CF_4/CHF_3$, $CF_4/Ar$, $CCl_2NF_3$, $CF_4/Cl_2$, $Cl_2/N_2/C_2F_6$, $CF_4/O_2$, $CF_4/CHF_3/Ar$, $C_2F_6$, $C_3F_8$, $C_4F_8/CO$, $C_5F_8$, or $CH_2F_2$.

During the formation of the channel holes 125, the substrate 100 may be over-etched to have a recessed top surface.

Figure 6:
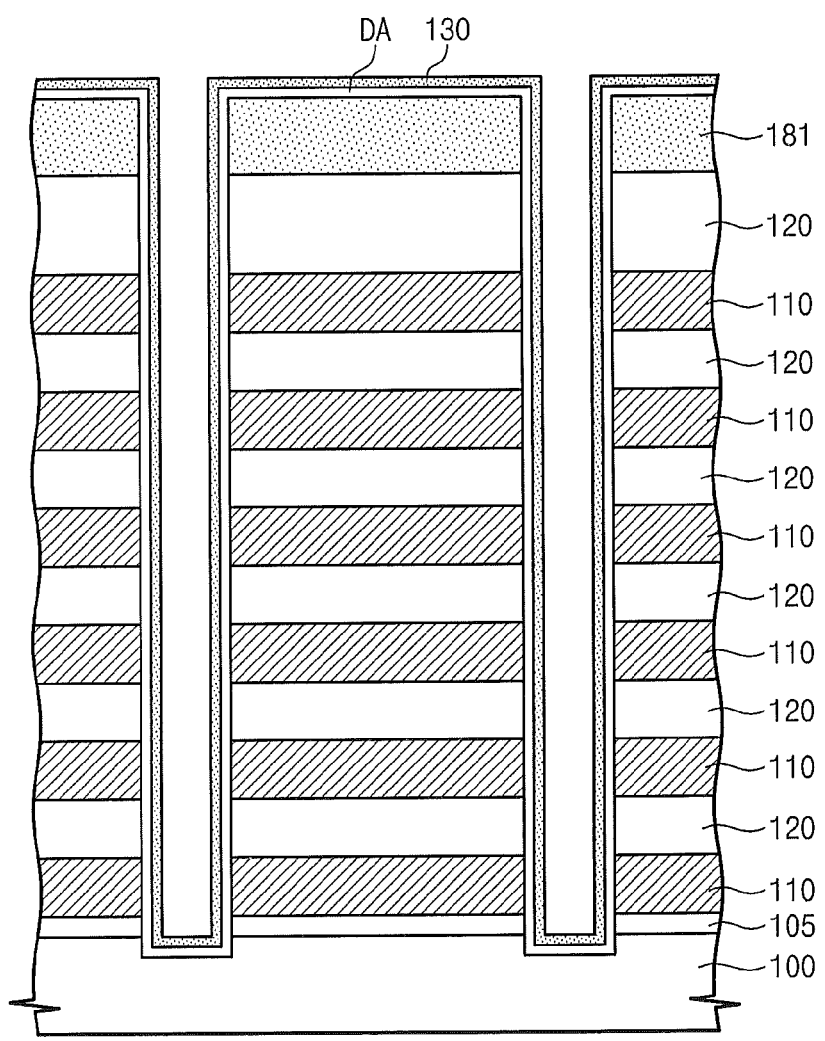

Referring to FIG. 6, the data storage layer DA and the first semiconductor layer 130 may be sequentially formed to cover side and bottom surfaces of the channel holes 125. The first semiconductor layer 130 may include at least one of silicon, germanium, or silicon-germanium. The data storage layer DA and the first semiconductor layer 130 may be formed in such a way that the channel holes 125 are not completely filled with them. The data storage layer DA and the first semiconductor layer 130 may be formed by ALD or CVD.

Figure 7:
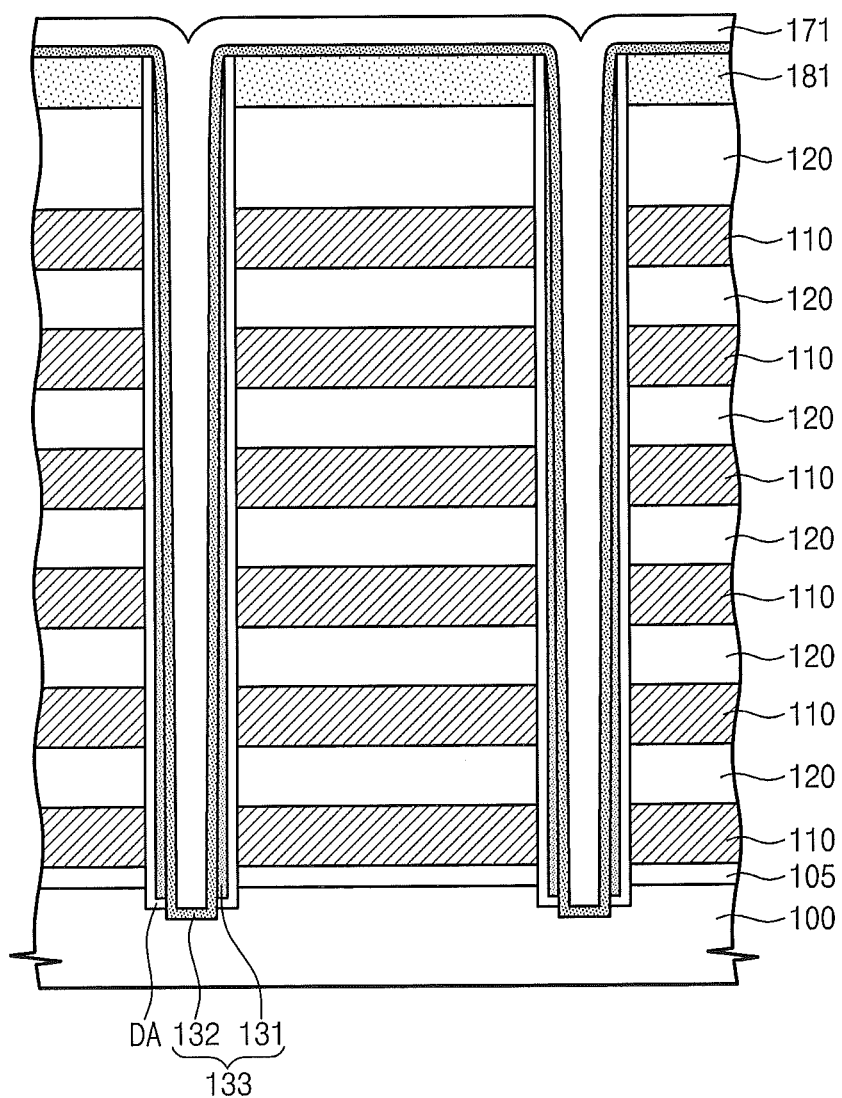

Referring to FIGS. 3 and 7, the first semiconductor layer 130 may be patterned to form the first semiconductor pattern 131. The formation of the first semiconductor pattern 131 may include an etching process, in which plasma is anisotropically used. Accordingly, bottom surfaces of the data storage layer DA may be etched during the formation of the first semiconductor pattern 131, and thus the substrate 100 may be exposed through the data storage layer DA. The etching process may be performed in such a way that the data storage layer DA is removed from a top surface of the mask pattern 181. After the etching process, the second semiconductor pattern 132 and an insulating gap-fill layer 171 may be sequentially formed on the resulting structure. The first and second semiconductor patterns 131 and 132 may constitute the semiconductor pattern 133. As a result, the data storage layers DA and the semiconductor pattern 133 may be formed in the channel holes 125 (in S3). The second semiconductor pattern 132 may extend along a sidewall of the first semiconductor pattern 131 and be connected to the substrate 100. The second semiconductor pattern 132 may include at least one of, for example, silicon, germanium, or silicon-germanium. The second semiconductor pattern 132 and the insulating gap-fill layer 171 may extend along a top surface of the mask pattern 181. The second semiconductor pattern 132 may be formed by, for example, ALD or CVD.

Figure 8:
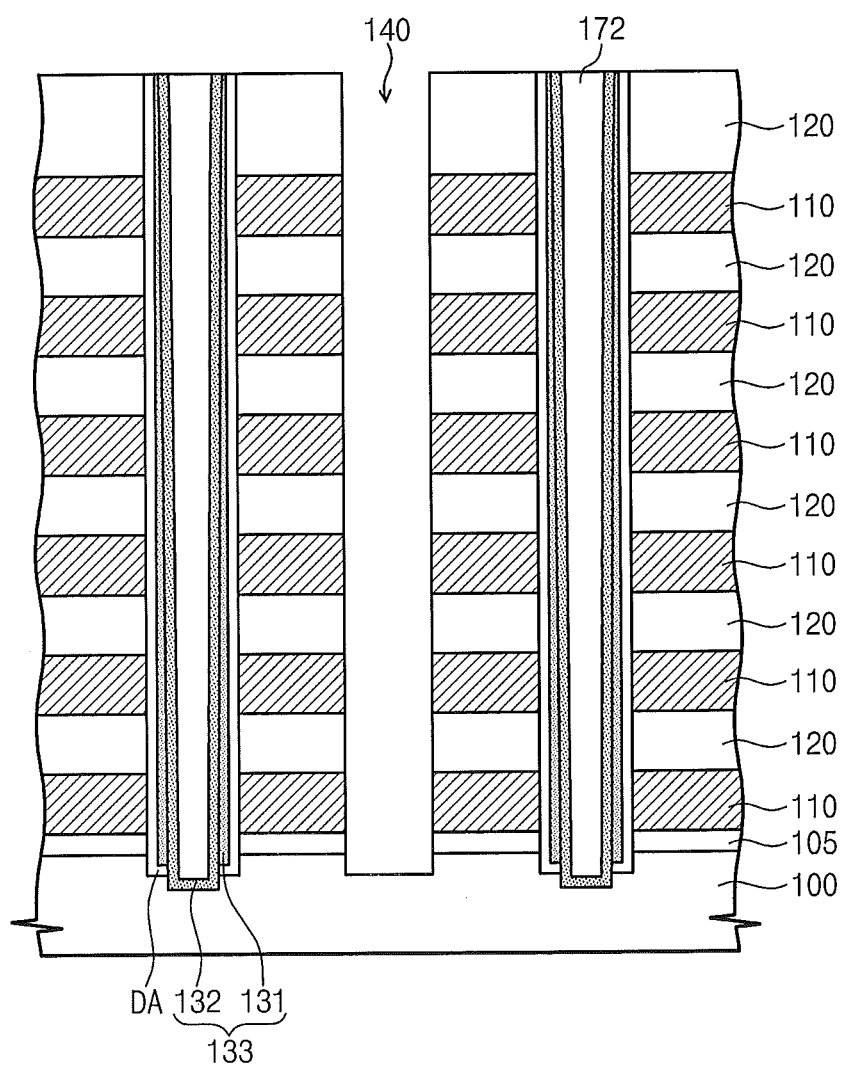

Referring to FIG. 8, an upper portion of the insulating gap-fill layer 171 may be removed to form the insulating gap-fill patterns 172. The formation of the insulating gap-fill patterns 172 may include, for example, a process of planarizing and/or etching the insulating gap-fill layer 171. The planarization and/or etching process may be performed to remove portions of the second semiconductor pattern 132 disposed outside the channel holes 125.

The electrode layers 110 and the insulating layers 120 may be patterned to form the trench 140. The formation of the trench 140 may include an anisotropic etching process. For example, the anisotropic etching process may be performed in substantially the same manner as the process for forming the channel holes 125. The trench 140 may be formed to expose sidewalls of the insulating layers 120 and the electrode layers 110 and the top surface of the substrate 100.

Figure 9:
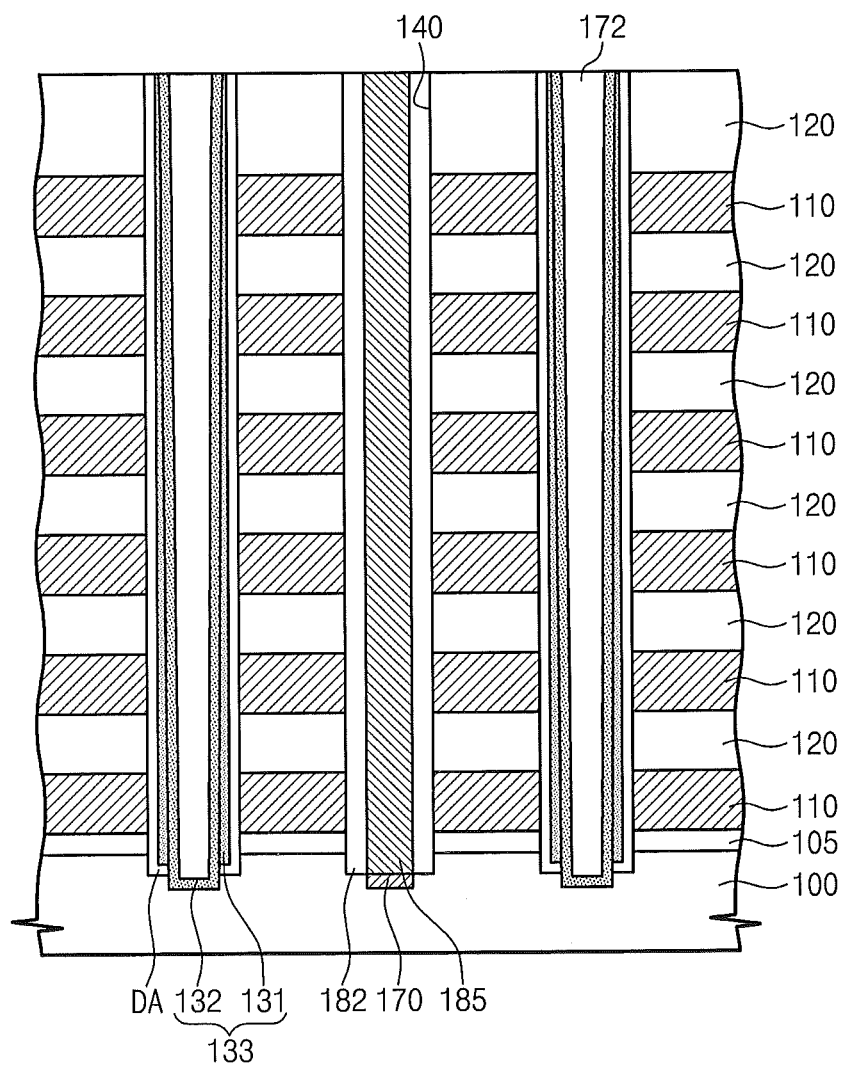

Referring to FIGS. 3 and 9, the insulating spacer 182 may be formed in the trench 140. The insulating spacer 182 may be formed by forming an insulating layer on the resulting structure with the trench 140 and anisotropically etching the insulating layer. Further, the formation of the insulating spacer 182 may include a step of exposing the substrate 100. The insulating spacer 182 may include at least one of a silicon oxide layer, a silicon nitride layer, or a silicon oxynitride layer.

The through electrode 185 may be formed on the resulting structure provided with the insulating spacer 182 to fill the trench 140 (in S4). For example, the through electrode 185 may be used to apply a common source voltage to the substrate 100. The through electrode 185 may include at least one of, for example, metals, conductive metal nitrides, or doped semiconductor materials. The metal-silicide layer 170 may be formed between the through electrode 185 and the substrate 100. The metal-silicide layer 170 may contribute to reduce a contact resistance between the through electrode 185 and the substrate 100. In some embodiments, the formation of the metal-silicide layer 170 may include a thermal treatment process to be performed after the formation of the through electrode 185. In other embodiments, the formation of the metal-silicide layer 170 may include forming a metal layer on the substrate 100 exposed by the insulating spacer 182 before the formation of the through electrode 185 and then performing a thermal treatment to the resulting structure. For example, the metal-silicide layer 170 may include tungsten silicide, titanium silicide, or cobalt silicide.

Referring back to FIG. 2, the conductive lines 198 may be formed to connect the semiconductor patterns 133 to each other. The conductive lines 198 may extend along the x direction and connect the semiconductor patterns 133 arranged along the x direction to each other. The conductive lines 198 may include at least one of, for example, metals, conductive metal nitrides, or doped semiconductor materials. The contact plugs 199 may be formed between the conductive lines 198 and the semiconductor patterns 133.

According to some embodiments of the inventive concept, the electrode structure with the metal-silicide layers and the insulating layers may be formed in an in-situ manner. The metal-silicide layers may serve as word lines of a semiconductor memory device. This makes it possible to fabricate a semiconductor memory device, without an additional process for forming the word lines. Further, since the data storage layer is not provided between the insulating layers and the metal silicide layers, it is possible to reduce a thickness of the electrode structure and thereby increase an integration density of the device.

Figure 10:
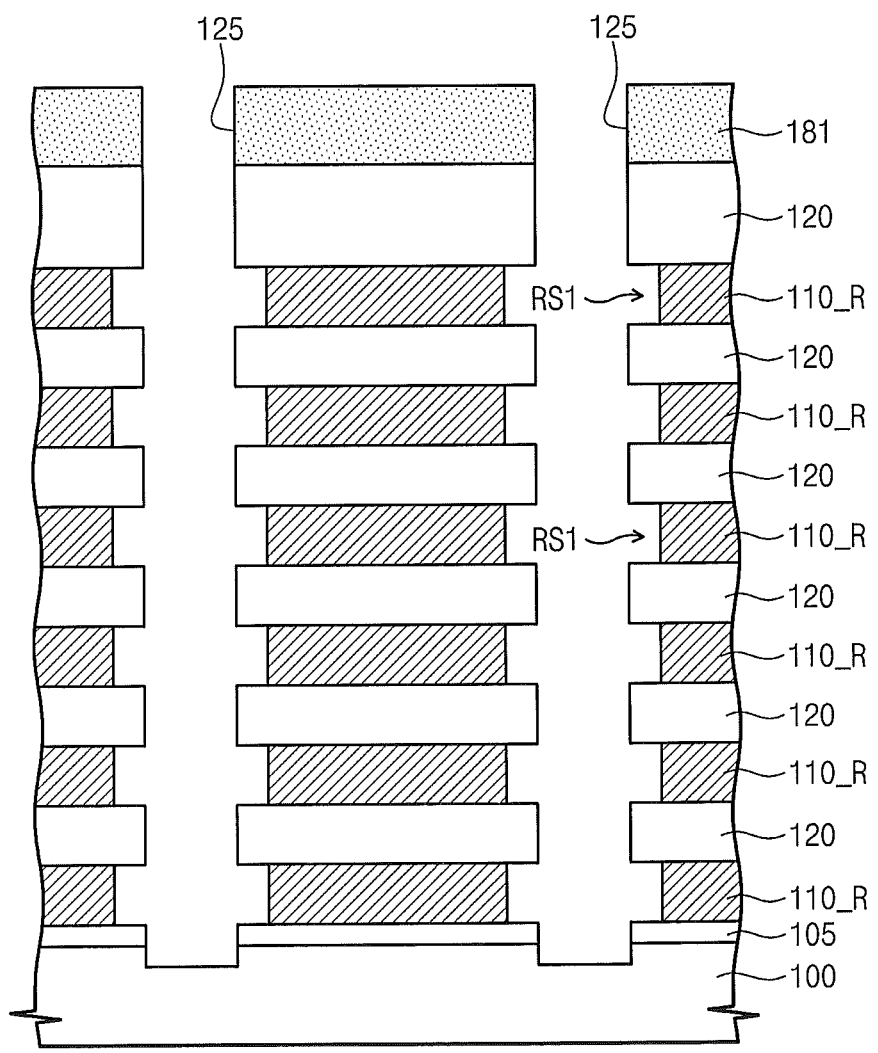
FIGS. 10 through 12 are sectional views illustrating a semiconductor memory device and a method of fabricating the same, according to other embodiments of the inventive concept.
Figure 11:
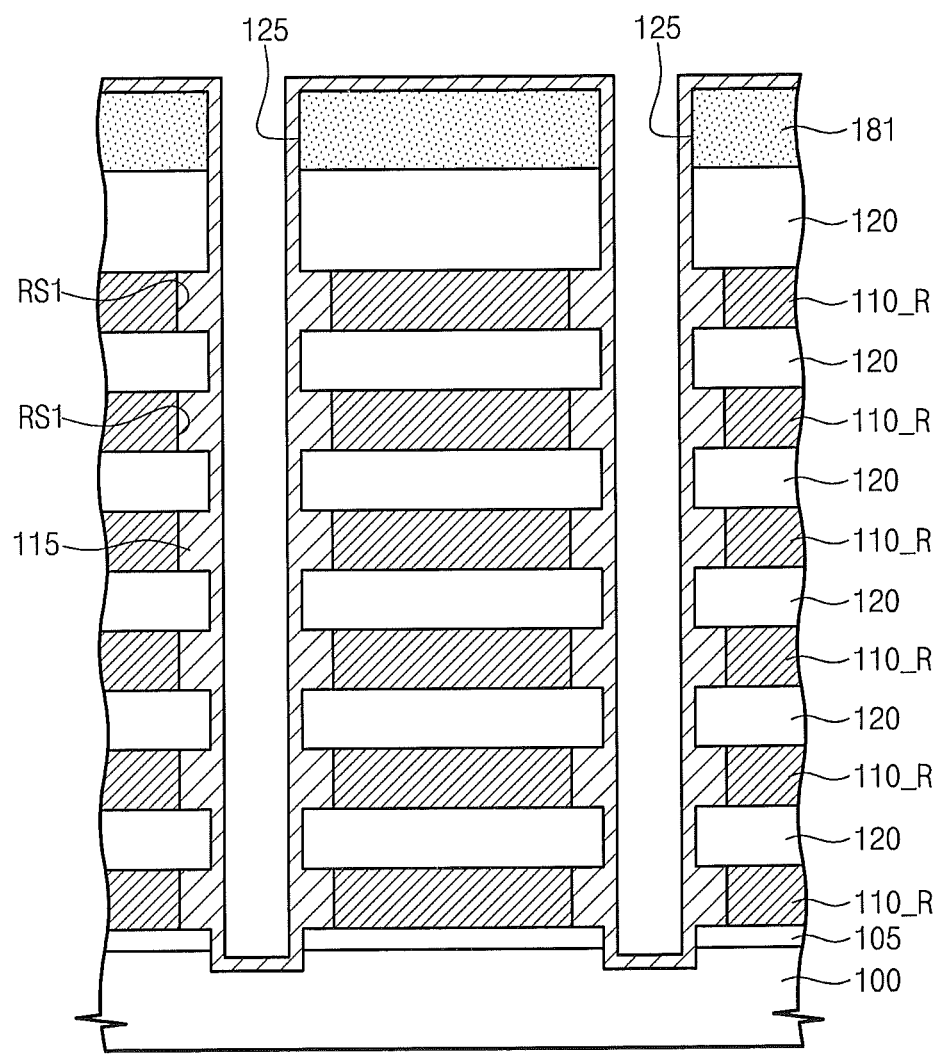
Figure 12:
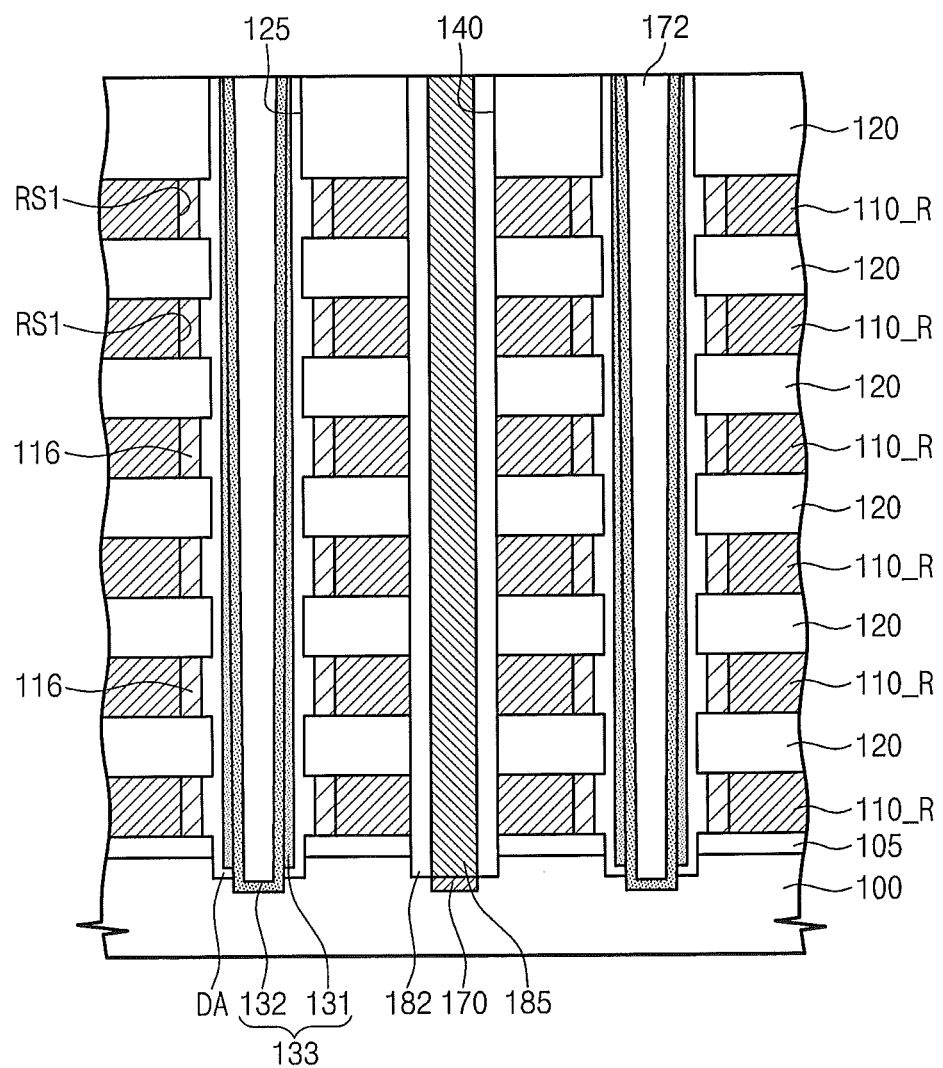

FIGS. 10 through 12 are sectional views illustrating a semiconductor memory device and a method of fabricating the same, according to other embodiments of the inventive concept. For the sake of brevity, the elements and features of this example that are similar to those previously shown and described will not be described in much further detail.

Referring back to FIG. 5, the electrode layers 110 exposed by the channel holes 125 may be horizontally recessed to form first recess regions RS1 as shown in FIG. 10. The first recess regions RS1 may be formed by a selective etching process. The formation of the first recess regions RS1 may include horizontally etching the electrode layers 110 using an etch recipe having an etch selectivity with respect to the insulating layers 120. The recessed electrode layers 110_R may have sidewalls recessed from the sidewalls of the insulating layers 120.

Referring to FIG. 11, a conductive layer 115 may be formed in the channel holes 125 to fill the first recess regions RS1. The conductive layer 115 may include a conductive metal nitride, such as a titanium nitride layer, a tantalum nitride layer, or a tungsten nitride layer. The conductive layer 115 may extend from the channel holes 125 to cover the top surface of the mask pattern 181, and it may be formed not to fill completely the channel holes 125. The conductive layer 115 may be formed by, for example, a sputtering process.

Referring to FIG. 12, the conductive layer 115 may be etched-back to form conductive patterns 116 in the first recess regions RS1. For example, the sidewalls of the insulating layers 120 may be exposed by the etch-back process. Each conductive pattern 116 and each recessed electrode layer 110_R that are in contact with each other may constitute a gate electrode.

The process described with reference to FIGS. 6 through 9 may be performed to the resulting structure provided with the conductive patterns 116. Accordingly, the data storage layer DA, the semiconductor pattern 133, and the insulating gap-fill pattern 172 may be sequentially formed in each of the channel holes 125, and the through electrode 185 may be connected to the substrate 100 through the recessed electrode layers 110_R. In addition, the insulating spacer 182 may be formed between the through electrode 185 and the recessed electrode layers 110_R, and the metal-silicide layer 170 may be formed between the through electrode 185 and the substrate 100. The recessed electrode layers 110_R may be in contact with the insulating spacer 182, and the conductive patterns 116 may be in contact with the data storage layers DA.

Figure 13:
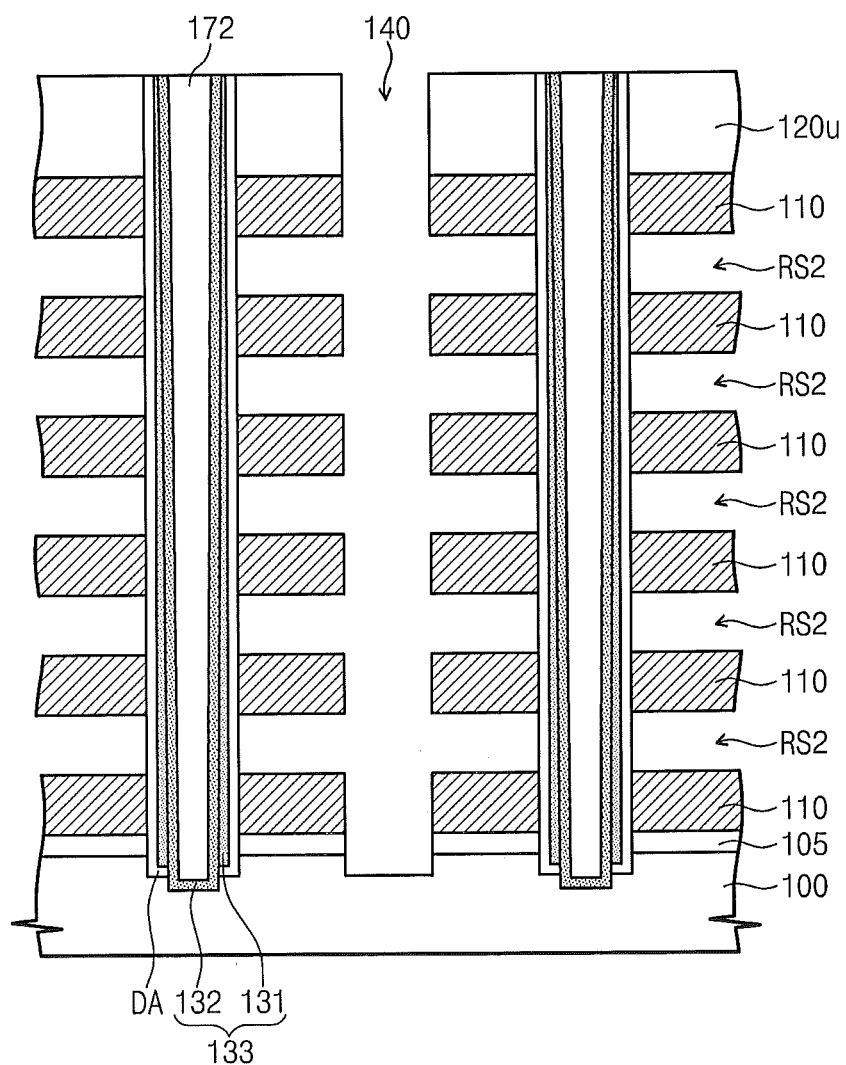
FIGS. 13 through 15 are sectional views illustrating a semiconductor memory device and a method of fabricating the same, according to still other embodiments of the inventive concept.
Figure 14:
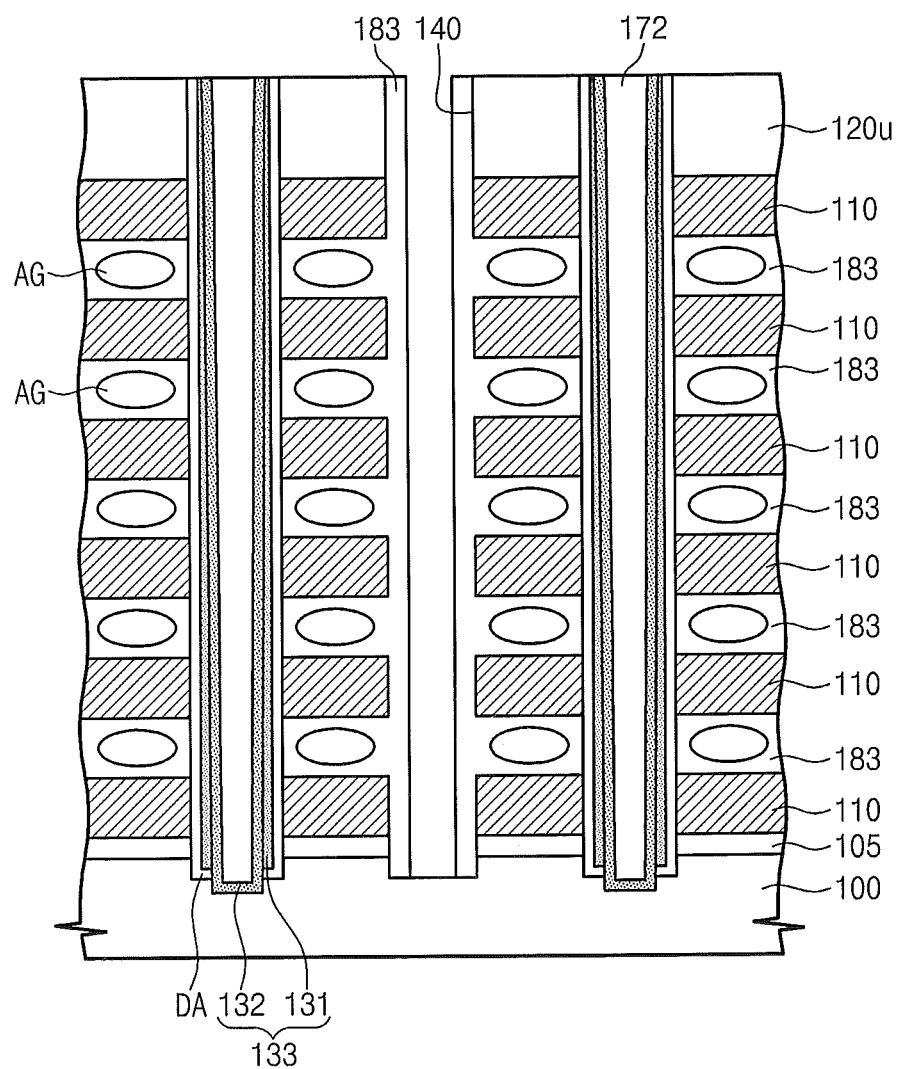
Figure 15:
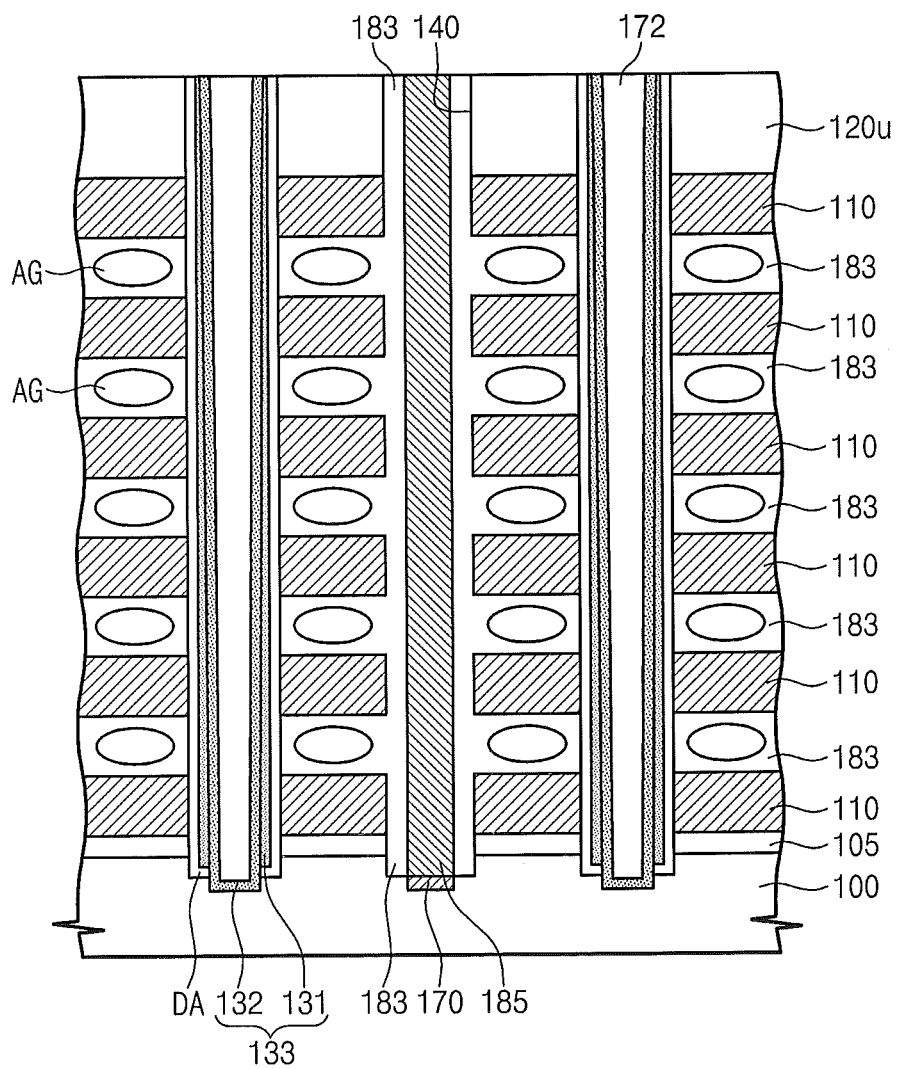

FIGS. 13 through 15 are sectional views illustrating a semiconductor memory device and a method of fabricating the same, according to still other embodiments of the inventive concept. For the sake of brevity, the elements and features of this example that are similar to those previously shown and described will not be described in much further detail.

Referring back to FIG. 8, the insulating layers 120 may be selectively removed to form second recess regions RS2 as shown in FIG. 13. In the following description to explain the present embodiment, the insulating layers 120 will be referred to as the first insulating layers 120. The uppermost one 120u of the first insulating layers 120 may include a material having an etch selectivity with respect to the others of the first insulating layers 120. For example, the uppermost insulating layer 120u may include a silicon oxide layer, and the others may include a silicon nitride layer. In this case, the first insulating layers 120, except for the uppermost insulating layer 120u, may be selectively removed by an etchant containing phosphoric acid ($H_3PO_4$). The insulating buffer layer 105 may include the same material as the uppermost insulating layer 120u.

Referring to FIG. 14, a second insulating layer 183 may be formed in the second recess regions RS2. The second insulating layer 183 may include an oxide layer, which may be formed using a deposition technique providing a poor step coverage property. This makes it possible to form air gaps AG in the second recess regions RS2. In some embodiments, the air gaps AG may be formed in all of the second recess regions RS2, as shown in FIG. 14. In other embodiments, the air gaps AG may be formed in some of the second recess regions RS2 and not in the others.

The second insulating layer 183 may be formed to cover the sidewall of the trench 140 or the sidewalls of the electrode layers 110. The second insulating layer 183 may be formed by forming an insulating layer to cover the electrode structure and anisotropically etching the insulating layer to expose the uppermost insulating layer 120u. As the result of the anisotropic etching, the top surface of the substrate 100 in the trench 140 may be exposed.

Referring to FIG. 15, the through electrode 185 may be formed to fill the trench 140. In some embodiments, the through electrode 185 may include at least one of, for example, metals, conductive metal nitrides, or doped semiconductor materials. The metal-silicide layer 170 may be formed between the through electrode 185 and the substrate 100. The metal-silicide layer 170 may contribute to reduce the contact resistance between the through electrode 185 and the substrate 100. The metal-silicide layer 170 may include, for example, tungsten silicide, titanium silicide, or cobalt silicide.

Figure 16:
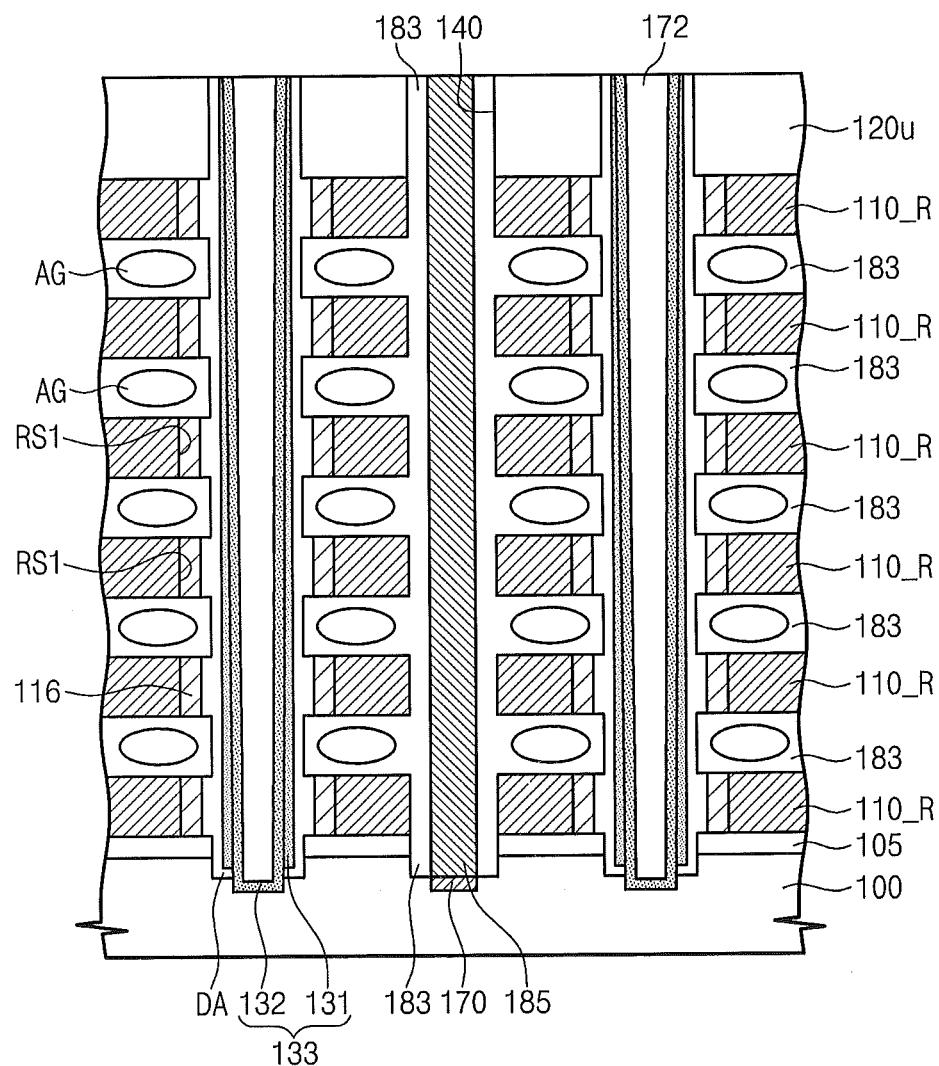
FIG. 16 is a sectional view illustrating a semiconductor memory device and a method of fabricating the same, according to even other embodiments of the inventive concept.

FIG. 16 is a sectional view illustrating a semiconductor memory device and a method of fabricating the same, according to even other embodiments of the inventive concept. For the sake of brevity, the elements and features of this example that are similar to those previously shown and described will not be described in much further detail.

The semiconductor memory device of FIG. 16 may be formed by performing the process described with reference to FIGS. 13 through 15, before the formation of the insulating spacer 182 of FIG. 12. Accordingly, the conductive patterns 116 may be formed to be in contact with the recessed electrode layers 110_R, and the second insulating layer 183 with the air gaps AG may be formed between the recessed electrode layers 110_R.

Figure 20:
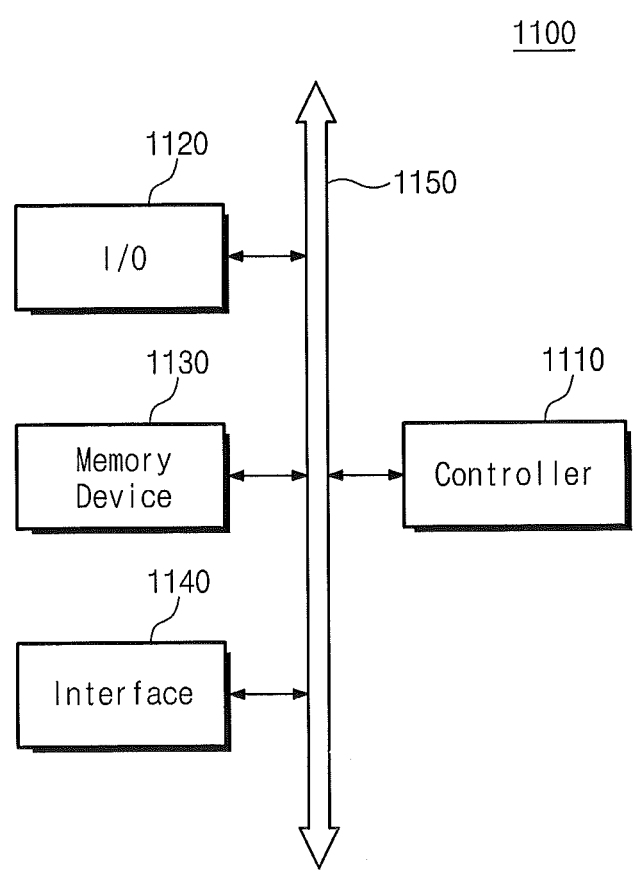
FIG. 20 is a schematic block diagram illustrating an example of electronic systems including semiconductor memory devices according to some embodiments of the inventive concept.

FIG. 20 is a schematic block diagram illustrating an example of electronic systems including semiconductor memory devices according to some embodiments of the inventive concept.

Referring to FIG. 20, an electronic system 1100 may be applied to a personal digital assistant (PDA), a portable computer, a web tablet, a wireless phone, a mobile phone, a digital music player or a memory card. The electronic system 1100 may also be applied to another electronic product that receives or transmits information data by wireless.

The electronic system 1100 may include a controller 1110, an input/output (I/O) unit 1120, a memory device 1130, an interface unit 1140 and a data bus 1150. At least two of the controller 1110, the I/O unit 1120, the memory device 1130 and the interface unit 1140 may communicate with each other through the data bus 1150. That is, the data bus 1150 may correspond to a path through which electrical signals are transmitted.

The controller 1110 may include at least one of a microprocessor, a digital signal processor (DSP), a microcontroller and the like. The memory device 1130 may store commands executed by the controller 1110. The I/O unit 1120 may receive data or signals from an external device or may transmit data or signals to the external device. The I/O unit 1120 may include a keypad, a keyboard or a display unit.

The memory device 1130 may include at least one of the semiconductor memory devices according to the exemplary embodiments described above. Alternatively, the memory device 1130 may include another type of semiconductor memory device which is different from the semiconductor memory devices described in the above embodiments. For example, the memory device 1130 may include a magnetic memory device, a phase change memory device, a dynamic random access memory (DRAM) device and/or a static random access memory (SRAM) device.

The interface unit 1140 may transmit electrical data to a communication network or may receive electrical data from the communication network.

Figure 21:
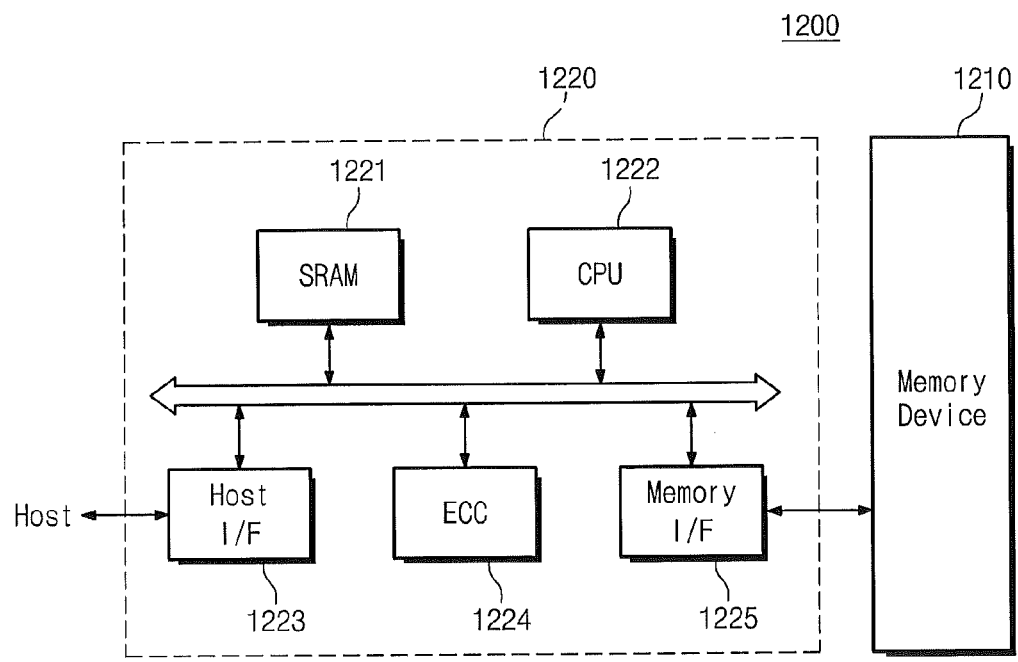
FIG. 21 is a schematic block diagram illustrating memory cards including the semiconductor devices according to some embodiments of the inventive concept.

FIG. 21 is a schematic block diagram illustrating memory cards including the semiconductor devices according to some embodiments of the inventive concept.

Referring to FIG. 21, a memory card 1200 may include a flash memory device 1210 having at least one of the semiconductor memory devices according to the exemplary embodiments described above. The memory card 1200 may be used as a data storage media for storing a large capacity of data. The memory card 1200 may further include a memory controller 1220 that controls data communication between a host and the flash memory device 1210.

The memory controller 1220 may include a static random access memory (SRAM) device 1221, a central processing unit (CPU) 1222, a host interface unit 1223, an error check and correction (ECC) block 1224 and a memory interface unit 1225. The SRAM device 1221 may be used as an operation memory of the CPU 1222. The host interface unit 1223 may be configured to include a data communication protocol between the memory card 1200 and the host. The ECC block 1224 may detect and correct errors of data which are read out from the flash memory device 1210. The memory interface unit 1225 may connect the memory controller 1220 to the flash memory device 1210. The central processing unit (CPU) 1222 may control overall operations for data communication of the memory controller 1220. The memory card 1200 may further include a read only memory (ROM) device that stores code data to interface with the host.

Figure 22:
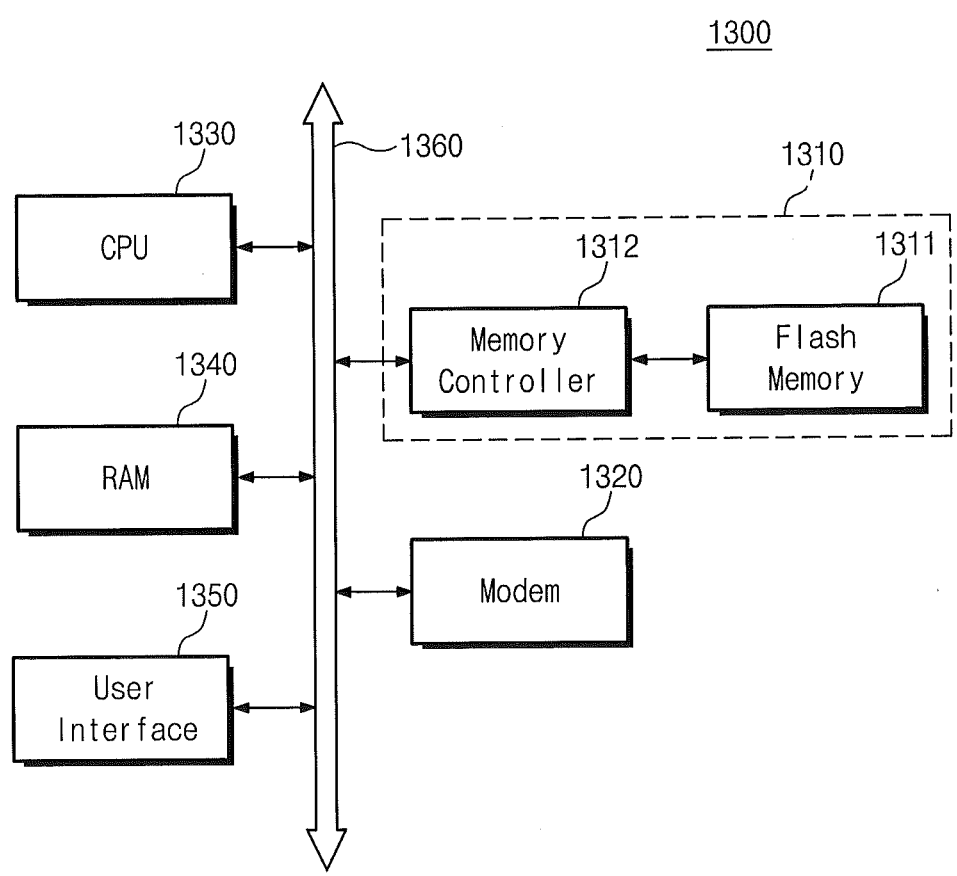
FIG. 22 is a block diagram illustrating information processing systems including the semiconductor devices according to some embodiments of the inventive concept.

FIG. 22 is a block diagram illustrating information processing systems including the semiconductor devices according to some embodiments of the inventive concept.

Referring to FIG. 22, an information processing system 1300 may be a mobile system, a desk top computer or the like. The information processing system 1300 may include a flash memory unit 1310 having at least one of the flash memory devices according to the exemplary embodiments described above. The information processing system 1300 may further include a modulator-demodulator (MODEM) 1320, a central processing unit (CPU) 1330, a random access memory (RAM) device 1340 and a user interface unit 1350. At least two of the flash memory unit 1310, the MODEM 1320, the CPU 1330, the RAM device 1340 and the user interface unit 1350 may communicate with each other through a data bus 1360. The flash memory unit 1310 may have substantially the same configuration as the memory card 1200 illustrated in FIG. 22. That is, the flash memory unit 1310 may include a flash memory device 1311 and a memory controller 1312 that controls overall operations of the flash memory device 1311. The flash memory unit 1310 may store data processed by the CPU 1330 or data transmitted from an external system. The flash memory unit 1310 may be configured to include a solid state disk. In this case, the information processing system 1300 may stably and reliably store the flash memory unit 1310 with a large capacity of data. If the reliability of the flash memory unit 1310 is improved, the information processing system 1300 may save sources that are required to check and correct data. As a result, the information processing system 1300 may provide fast data communication. The information processing system 1300 may further include a camera image processor, an application chipset and/or an input/output unit.

The semiconductor memory devices according to the exemplary embodiments described above may be encapsulated using various packaging techniques. For example, the semiconductor memory devices according to the aforementioned exemplary embodiments may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic quad flat package (PQFP) technique, a thin quad flat package (TQFP) technique, a small outline package (SOIC) technique, a shrink small outline package (SSOP) technique, a thin small outline package (TSOP) technique, a system in package (SIP) technique, a multi chip package (MCP) technique, a wafer-level fabricated package (WFP) technique and a wafer-level processed stack package (WSP) technique.

According to some embodiments of the inventive concept, it is possible to form an electrode structure including insulating layers and metal silicide layers in an in-situ manner.

According to other embodiments of the inventive concept, it is possible to provide a semiconductor memory device with high density.

While some embodiments of the inventive concepts have been particularly shown and described, it will be understood by one of ordinary skill in the art that variations in form and detail may be made therein without departing from the spirit and scope of the attached claims.

What is claimed is:

1. A method of fabricating a semiconductor memory device, comprising:
    forming an electrode structure including insulating layers and electrode layers alternatingly stacked on a substrate;
    forming a channel hole to penetrate the electrode structure;
    forming a data storage layer on a sidewall of the channel hole; and
    forming a semiconductor pattern on a sidewall of the data storage layer to be electrically connected to the substrate,
    forming a trench penetrating the electrode structure;
    partially removing the electrode layers exposed by the trench to form first recess regions;
    forming conductive patterns in the first recess regions to be in contact with the electrode layers; and
    sequentially forming an insulating spacer and a through electrode in the trench,
    wherein the electrode layers are metal-silicide layers, and the insulating layers and the electrode layers are formed in an in-situ manner using the same deposition system.

2. The method of claim 1, wherein the deposition system comprises a first chamber, in which the electrode layers are formed, and a second chamber, in which the insulating layers are formed.

3. The method of claim 2, wherein the first chamber is a PVD chamber and the second chamber is a CVD chamber.

4. The method of claim 3, wherein the electrode layers are formed using a metal-silicide target.

5. The method of claim 3, wherein the electrode layers are formed using a metal target and a silicon target.

6. The method of claim 1, further comprising forming a metal-silicide layer between the through electrode and the substrate.

7. The method of claim 1, wherein the conductive patterns comprises a conductive metal nitride.

8. The method of claim 1, further comprising:
    selectively removing the insulating layers exposed by the trench to form second recess regions; and
    forming an additional insulating layer defining air gaps in the second recess regions.

9. The method of claim 8, wherein the forming of the insulating spacer comprises anisotropically etching the additional insulating layer.

10. A method of fabricating a semiconductor memory device, comprising:
    forming, in an in-situ manner using a same deposition system, an electrode structure comprising insulating layers and electrode layers alternatingly stacked on a substrate;
    forming a channel hole to penetrate the electrode structure;
    for a data storage layer on a sidewall of the channel hole, wherein the electrode layers comprise metal-silicide layers; and
    forming a metal nitride layer between the electrode layers and the data storage layer,
    wherein forming the electrode layers comprises a sputtering process using a metal-silicide and/or silicon target.

11. The method of claim 10, wherein the deposition system comprises a first chamber, in which the electrode layers are formed, and a second chamber, in which the insulating layers are formed.

12. The method of claim 11, wherein the first chamber and the second chamber are part of a same vacuum system, and wherein forming an electrode structure comprises:
transferring the substrate between the first chamber and the second chamber without substantial breakage of a vacuum level.

13. The method of claim 11, wherein the first chamber and the second chamber have different vacuum levels.

14. The method of claim 11, further comprising:
performing a first deposition process in the first chamber to form each electrode layer; and
performing a second deposition process in the second chamber to form each insulating layer, wherein the first and second deposition processes are different.

15. The method of claim 10, further comprising:
forming a semiconductor pattern on a sidewall of the data storage layer to be electrically connected to the substrate;
forming a trench penetrating the electrode structure;
sequentially forming an insulating spacer and a through electrode in the trench; and
forming a metal-silicide layer between the through electrode and the substrate.

16. A method of fabricating a semiconductor memory device, comprising:
forming, in an in-situ manner using a same deposition system, an electrode structure comprising first insulating layers and metal-silicide electrode layers alternatingly stacked on a substrate, wherein the insulating layers are formed in a first chamber of the same deposition system and the metal-silicide electrode layers are formed in a second chamber of the same deposition system;
forming a channel hole to penetrate the electrode structure through to the substrate;
forming a trench to penetrate the electrode structure through to the substrate;
removing the first insulating layers exposed by the channel hole and the trench to form first recess regions;
forming second insulating layers in the first recess regions using a deposition technique providing a step coverage property such that the second insulating layers in the first recess regions have air gaps;
partially removing the electrode layers exposed by the channel hole to form second recess regions;
forming a metal-nitride conductive layer in the channel hole;
partially removing the metal-nitride conductive layer to form metal-nitride conductive patterns in the second recess regions, the metal-nitride conductive patterns contacting the electrode layers;
forming a data storage layer on a sidewall of the channel hole to be in contact with the metal-nitride conductive patterns;
forming a first semiconductor pattern on a sidewall of the data storage layer;
forming a second semiconductor pattern on a sidewall of the first semiconductor pattern to be electrically connected to the substrate;
sequentially forming an insulating spacer and a through electrode in the trench; and
forming a metal-silicide layer between the through electrode and the substrate.

* * * * *